(12) United States Patent
Yu

(10) Patent No.: US 6,226,216 B1
(45) Date of Patent: May 1, 2001

(54) SECTIONAL COLUMN ACTIVATED MEMORY

(75) Inventor: Wing K. Yu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/489,096

(22) Filed: Jan. 21, 2000

(51) Int. Cl.[7] .................................................. G11C 8/00
(52) U.S. Cl. ................ 365/230.03; 365/154; 365/185.07
(58) Field of Search .............................. 365/230.03, 154, 365/185.07

(56) References Cited

U.S. PATENT DOCUMENTS

| | | | | |
|---|---|---|---|---|
| 5,157,631 | * | 10/1992 | Shimogawa | 365/203 |
| 5,400,275 | * | 3/1995 | Abe et al. | 365/145 |
| 5,570,319 | * | 10/1996 | Santoro et al. | 365/230.03 |
| 5,675,529 | * | 10/1997 | Poole | 365/63 |
| 5,729,501 | * | 3/1998 | Phillips et al. | 365/230.03 |
| 5,933,373 | * | 8/1999 | Takahashi | 365/189.06 |
| 5,959,887 | * | 9/1999 | Takashina et al. | 365/185.13 |
| 6,026,021 | * | 2/2000 | Hoang | 365/185.11 |
| 6,058,065 | * | 5/2000 | Lattimore et al. | 365/230.03 |

* cited by examiner

*Primary Examiner*—David Nelms
*Assistant Examiner*—Connie C. Yoha
(74) *Attorney, Agent, or Firm*—Trop, Pruner & Hu, P.C.

(57) ABSTRACT

A memory may include sectional columns so that groups of cells on the same column but coupled to different word lines may be selectively accessed. As a result, only a portion of the cells of a given column is activated at any given time. The remainder of the column may be decoupled, thereby reducing the need to charge up or discharge the rest of the column. Because only a smaller portion of the column is charged or discharged, the lower capacitance associated with a lower number of cells may result in a speed and power consumption improvement.

22 Claims, 5 Drawing Sheets

SECTIONAL COLUMN ACTIVATED MEMORY

BACKGROUND

This invention relates generally to semiconductor memories.

Semiconductor memories generally include an array of cells arranged in rows and columns. A sense amplifier coupled to a column detects the state of a selected cell coupled to the column. Generally, the cell is selected through a word line coupled to the cell.

Examples of semiconductor memories include random access memories (RAMs), such as static random access memories (SRAMs) and dynamic random access memories (DRAMs). Examples of read only memories (ROMs) include erasable programmable read only memories (EPROMs), electrically erasable read only memories (EEPROMs) and flash memories. Both ROMs and RAMs include a number of cells coupled to columns with sense amplifiers to determine the state of a selected cell.

Memories using columns of cells coupled to sense amplifiers are subject to increasing capacitance as the density or number of cells increases. More capacitance means that the memory is slower. Thus, memories that store more information need more cells, but more cells means slower speeds in reading information from the memory or writing information into the memory (when possible).

SRAMs are advantageous in a number of environments largely because they do not require that the memory cells be refreshed. SRAMs may enjoy a higher speed and lower standby or static power dissipation in some environments. Thus they are particularly applicable to battery-operated systems. SRAMs may use complementary metal oxide semiconductor (CMOS), bipolar, BICMOS, and gallium arsenide technologies, as examples.

It is desirable that the power dissipation of any memory be as low as possible. Particularly in memories, such as SRAMs, which are often used in battery-powered applications, the need for low power dissipation is acute.

In addition, there is a need for higher speed memories. As microprocessors become ever faster, the memories used with such microprocessors need to keep pace. Thus relatively faster memories are always needed. As the density of memories increases, this adds more capacitance to the word lines, bit lines and sense lines, slowing these memories. Thus, advances which enable ever more dense memories also inherently decrease the speed of those memories.

A number of efforts have been made to improve the speed of SRAMs. For one thing, address transition detection (ATD) has been adopted. In ATD, the bit lines are equalized prior to a new access. This reduces the needed voltage swing. Also, advanced technologies use ever-faster sense amplifiers.

A number of SRAMs use so-called short bit lines. In a short bit line the chip is laid out at 90 degrees to that used in the past. This results in shorter bit lines, lowering the bit line capacitance. As a result, higher speed signals may be developed.

Thus, there is a need for even faster memories which may consume less power and take up substantially the same or less integrated circuit space.

SUMMARY

In accordance with one aspect, a semiconductor memory includes a column. A first and a second group of memory cells are each selectively couplable to the column. The first group is coupled to the column when the second group is decoupled from the column.

Other aspects and advantages are set forth in the accompanying detailed description and claims.

DETAILED DESCRIPTION

Figure 1:
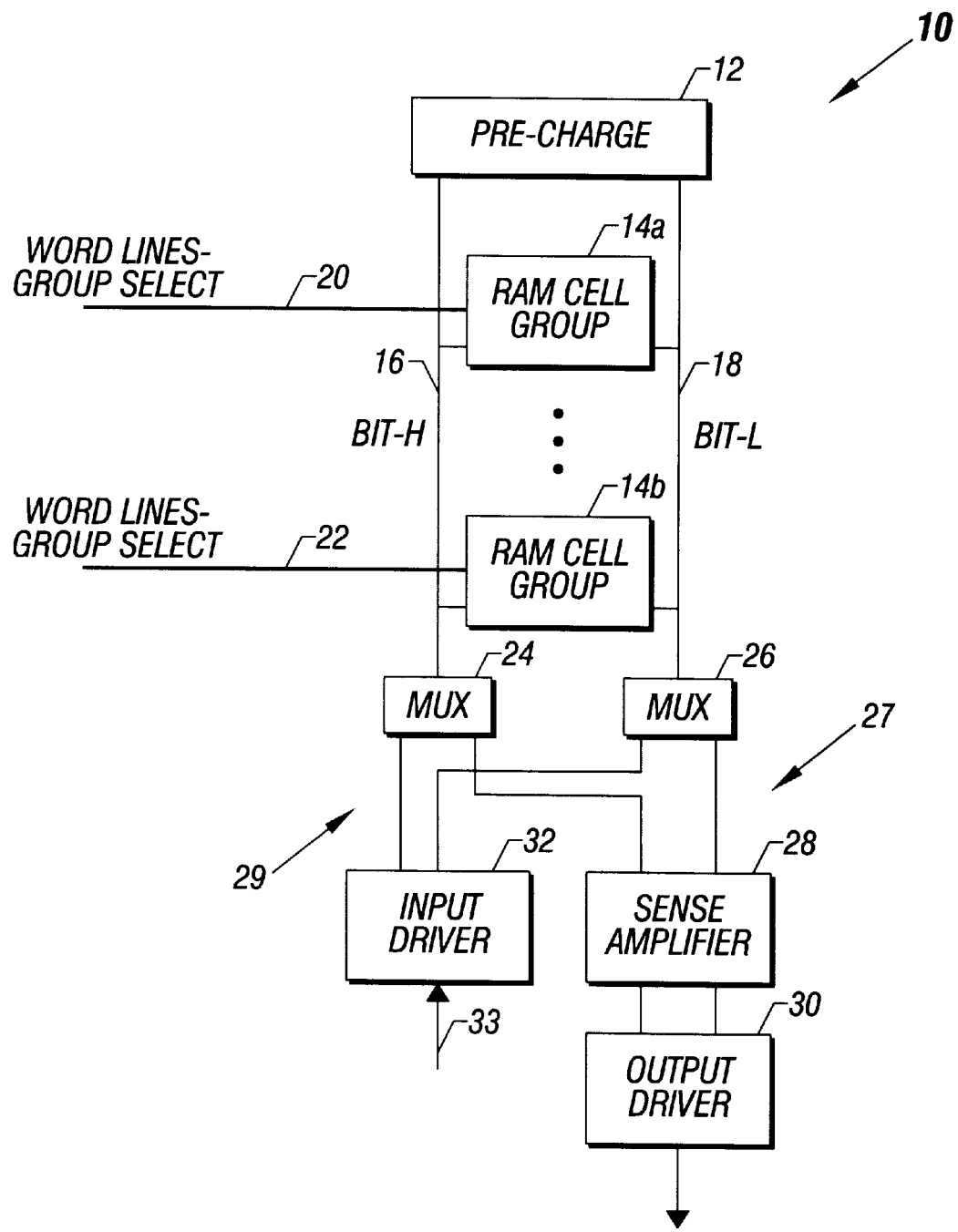
FIG. 1 is a block depiction of one embodiment of the present invention.

Referring to FIG. 1, a sectional SRAM architecture 10 includes a column which may include a pair of bit lines 16 and 18 selectively couplable to a series of RAM cell groups 14. The groups 14 constitute sections on a column of the SRAM architecture 10. Each of the groups 14, such as the groups 14a and 14b, may be accessed by group select lines 20 and 22.

Each bit line 16 or 18 may be coupled to a multiplexor 24 or 26 which may selectively couple the bit lines 16 and 18 to either an input driver 32 for write operations or a sense amplifier 28 for read operations. The sense amplifier 28 is in turn coupled to an output driver 30.

Through the use of a sectional column architecture, each column group 14 may be separately activated and coupled to the column while the remaining groups may be decoupled from the column. As a result the amount of capacitance which must be charged up on the column may be significantly reduced.

While an SRAM architecture is described as one example, the present invention is applicable to other semiconductor memories, including RAMs and ROMs generally. Thus, the sectional column architecture may be used with a variety of memories that have columns and sense amplifiers coupled to the columns. Moreover, while a voltage sensing sense amplifier is described, the present invention is not limited to any particular sense amplifier design and may include current sensing sense amplifiers as well.

Figure 6:
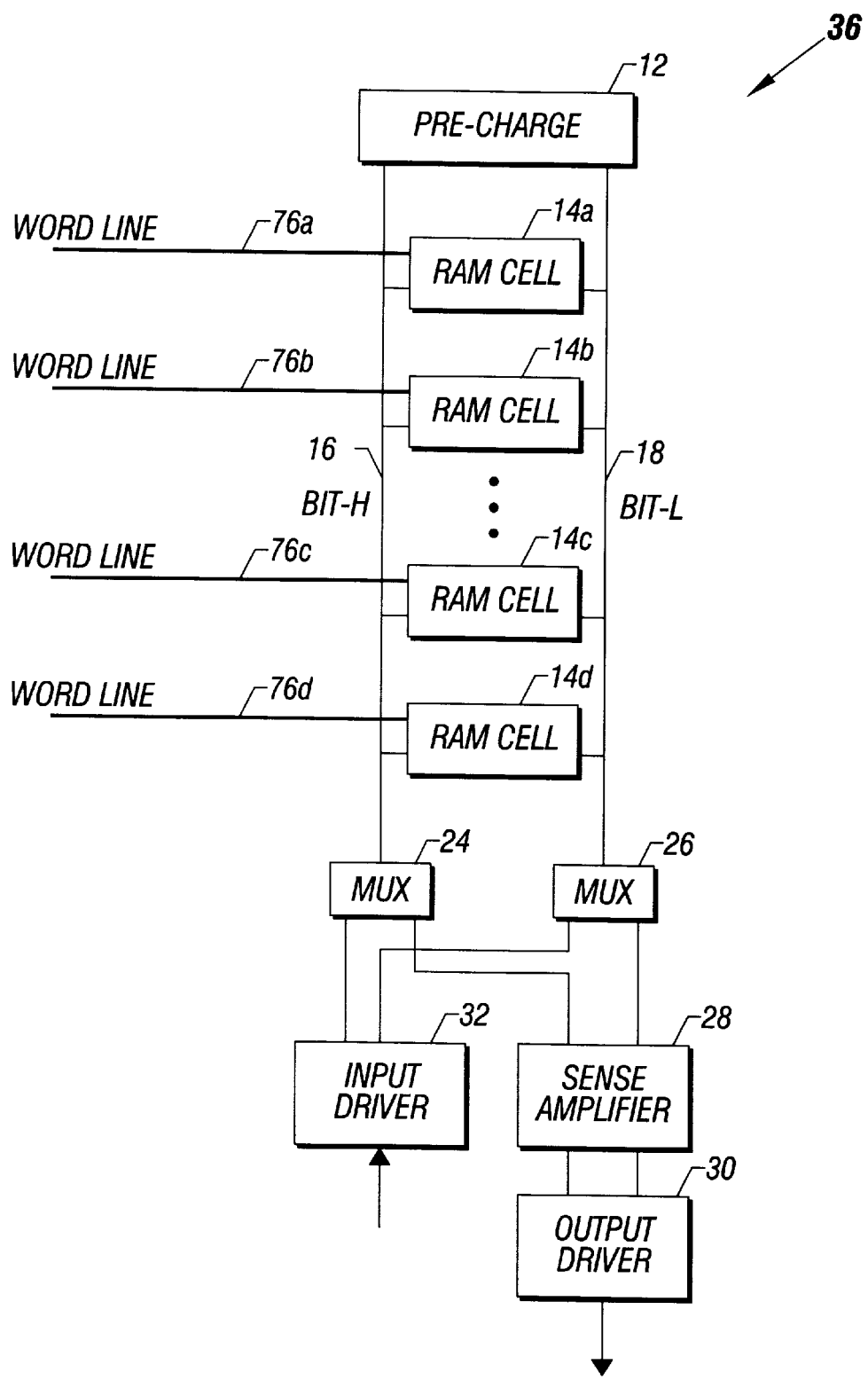
FIG. 6 is a conventional SRAM column architecture.

In a conventional SRAM 36, as shown for example in FIG. 6, the whole column of RAM cells 14 is charged when the cells are pre-charged (through a precharge device 12) and discharged thereafter. The larger capacitance arising from all the cells on the bit lines 16 and 18, makes it harder for each cell 14 to pull bit lines 16 or 18 down to change the output detected by the sense amplifier 28. As a result, the sense amplifier 28 normally detects small potential differences on the bit lines 16 and 18 and amplifies those differences in order to read a SRAM cell 14 in a relatively short time. However, the sense amplifier 28, shown in FIG. 6, waits for the bit lines 16, 18 to discharge to a significantly lower voltage in order to distinguish a state indicating signal from noise. Hence, the faster the bit line 16 or 18 discharges, the better the performance of the SRAM 36.

Figure 2:
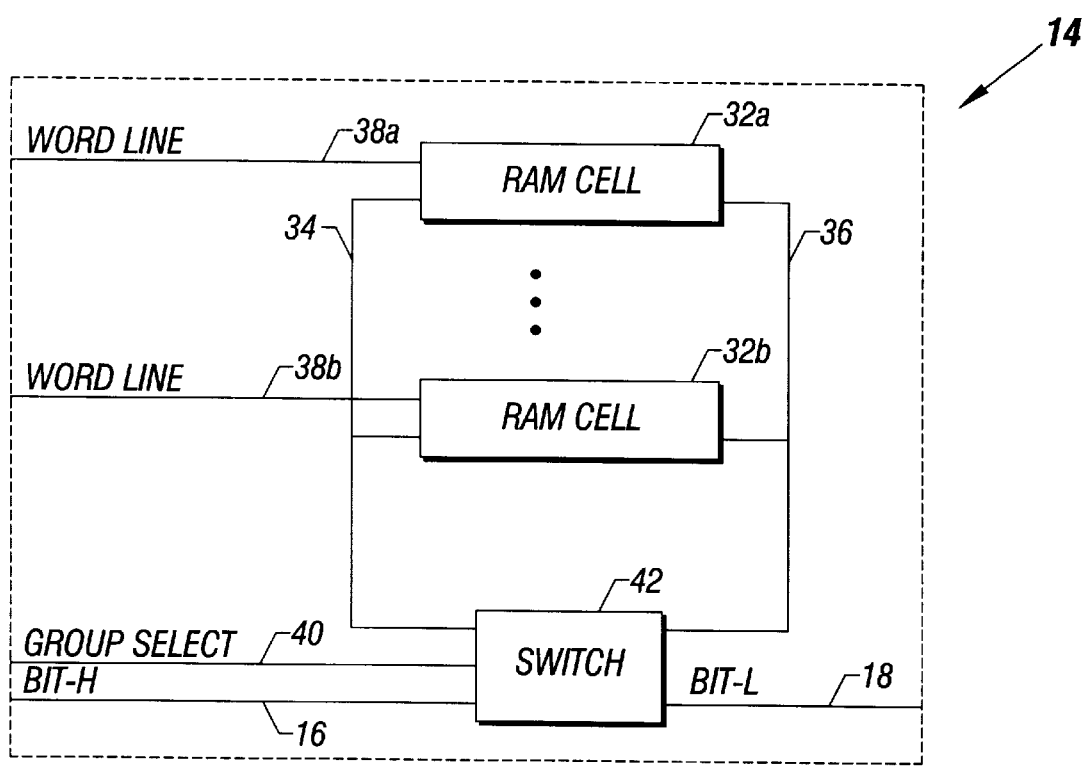
FIG. 2 is a more detailed block diagram of a RAM cell group shown in FIG. 1 in accordance with one embodiment to the present invention.

Referring now to FIG. 2, each group 14 includes a plurality of RAM cells 32, each coupled to a word line 38 and a local bit line 34 or 36. The local bit lines 34 and 36 couple each cell 32 to a switch 42. The local bit lines 34 and 36 may carry data and inverse data respectively.

The local bit lines 34 and 36 may be coupled to a global bit lines 16 and 18 through the switch 42. The switch 42 is controlled by a group select line from a word line decoder (not shown). The decoder may set the group select line to logic high when a word line 38 within that group is selected in one embodiment of the invention. The group signal may be extracted from conventional word line decoders which continue to decode higher level signals that correspond to group word line signals to eventually reach the level of individual word lines.

RAM cell groups 14 may be connected to the global bit lines 16 and 18. Only the selected group 14 exposes the global bit lines 16 and 18 to the capacitance of the associated RAM cells 32 and bit line structure 34, 36 in a read or write operation. As a result, the switch 42 isolates the global bit lines 16 and 18 from the effects of a substantial portion of the local capacitance of the RAM cell groups 14 which are not selected.

Figure 3:
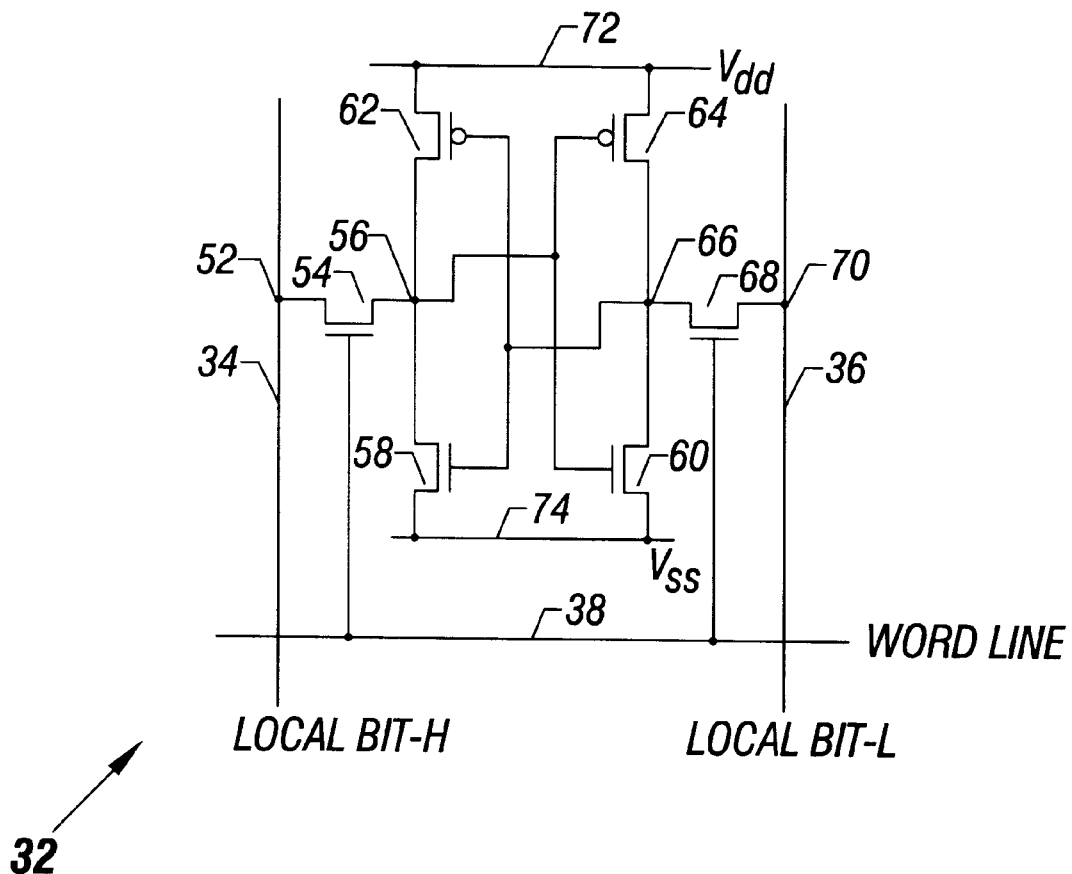
FIG. 3 is a SRAM cell design according to one embodiment of the present invention.

Referring to FIG. 3, a memory cell 32 may include a pair of select transistors 54 and 68 coupled to the local bit lines 34 and 36. A voltage or current difference between the bit lines 34 and 36 may be measured to determine the state of a cell 32.

The cell 32 may include a pair of inverters with transistors 62 and 58 and the transistors 64 and 60 arranged in a cross-coupled arrangement to produce a flip-flop device. The cell 32 has two stable states generally called the zero and one states. Conventionally, in the one state, the node 56 is high, the node 66 is low and as a result, the transistors 58 and 64 are off and the transistors 62 and 60 are on or conducting. Conversely, for the zero state, the node 56 is low and the node 66 is high and the on and off states of the transistors are all in the opposite on or off condition from the one state. Both states are stable and neither flip-flop branch conducts absent an applied direct current voltage.

To read the cell 32, a row address signal is applied to a row address decoder, causing the word line 38 of the addressed row to go to a high logic state. As a result, the nodes 56 and 66 for the cells on the addressed word line couple to the local bit lines 34 and 36. The data in the cell pulls one of the bit lines 34 or 36 lower. The differential signal between the bit lines 34 and 36 is then detected.

If the cell is in a one state, then the transistor 58 is off and transistor 60 is on. After the word line 38 goes high, current flows from the bit line 18 through the transistor 68 and 60 to the $V_{SS}$ or ground node 74. As a result the bit line 36 becomes lower in voltage than the bit line 34 and this differential condition is detected as a logic one state.

If the cell stores a logic zero state, current flows through the transistors 54 and 58 to $V_{SS}$ or ground 74. As a result, the bit line 34 becomes lower than the bit line 36.

The data stored in the cell 32 is unaffected by the read operation. The bit that is read out onto the bit lines 16 and 18 is conveyed to a data bus 27, shown in FIG. 1. From the data bus the bit is transferred to a sense amplifier 28 which detects the differential between the bit lines and outputs the data to an output buffer 30.

To write a zero or one into a cell 32, data is placed on the bit line 34 and inverse data is placed on the bit line 36. The word line 38 is activated, forcing the cell 32 to flip into the state represented on the bit lines and to store the new state.

In particular, if the bit line 34 is high and the bit line 36 is low, a one state is stored. Conversely if the bit line 34 is low and the bit line 36 is high, the zero state may be stored. Generally, the bit lines have the appropriate potentials supplied to them and then the word line is raised to flip the cell state.

Once the proper word line and bit lines are selected, the data on a data-in pin 33 is passed through an input buffer 32 onto the data bus 29, shown in FIG. 1. The data on the data bus 29 is then written over the selected global bit lines 16 and 18 to the local bit lines 34 and 36.

Figure 4:
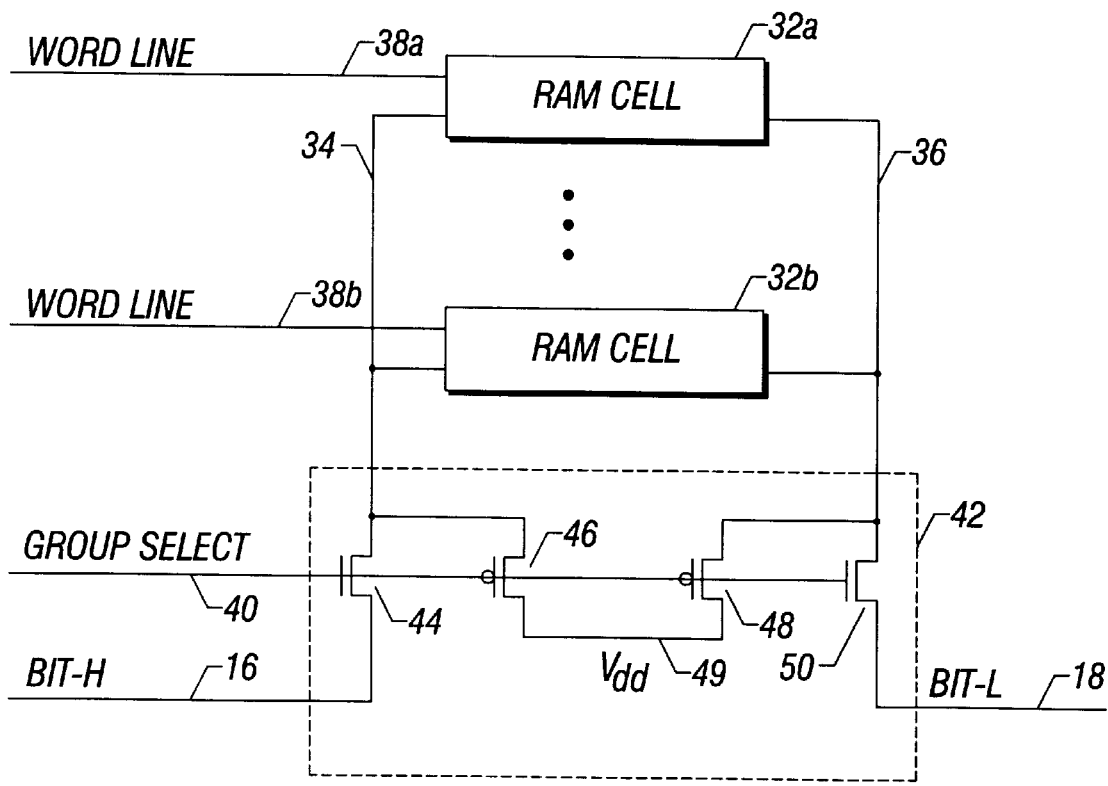
FIG. 4 is a circuit diagram for the switch shown in FIG. 2, in accordance with one embodiment of the present invention.

Referring next to FIG. 4, the switch 42 may be made up of two N-type field effect transistors 44 and 50 and two P-type field effect transistors 46 and 48 that are controlled by the group select line 40 in one embodiment of the present invention. The sizes of the two N-type transistors 44 and 50 may be compatible with the sizes of the N-type transistors 54 and 68 controlled by the word line 38 in a SRAM cell, shown in FIG. 3. In one embodiment of the present invention, the two P-type transistors 46 and 48 may be the smallest possible size.

The group select line 40 has a logic OR function for the word lines 38. When the group select line 40 is high, the transistors 44 and 50 couple the local bit lines 34 and 36 to the global bit lines 16 and 18. When the group select line 40 is low, transistors 44 and 50 decouple the local bit lines 34 and 36 from the global bit lines 16 and 18 and the power supply $V_{dd}$, indicated at 49, pre-charges the local bit lines 34 and 36 through the transistors 46 and 48.

In one embodiment of the present invention, the global bit lines 16 and 18 may use a different metal interconnect layer than the local bit lines 34 and 36. Because the global bit lines do not carry the entire capacitance burden, the global bit lines 16 and 18 may be driven much faster.

Figure 5:
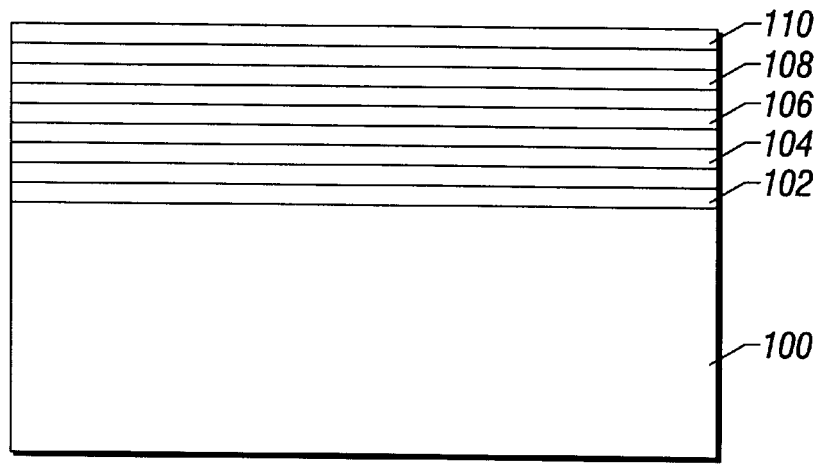
FIG. 5 is a greatly enlarged schematic cross-sectional view of a semiconductor structure in accordance with one embodiment of the present invention.

For example, referring to FIG. 5, a metal two metallic interconnection layer 104 may be used for the local bit lines 34 and 36 and the metal three layer 106 may be used for the word lines 38 and the group select lines 40 in one embodiment of the present invention. Then, a metal four layer 108 may be used for the global bit lines 16 and 18. A metal five layer 108, and a metal one layer, over a substrate 100, may be used to make other interconnections.

A number of architectures for the memory array may be utilized. For example, four sets of 128 word lines SRAM arrays may be utilized to make up a 512 word line array in one embodiment of the invention. Two sets of 256 word lines SRAM arrays may be used to make up a 512 word line array. One set of 512 word line SRAM arrays may also be used.

Compared to architectures which do not use the sectional column architecture, the use of four sets of 128 word line SRAM arrays may have a discharge rate 2.475 times faster than that of the conventional structure using two sets of 256 word line arrays, in accordance with one embodiment of the present invention. The bit line power consumption may be less than one-third that of the conventional structure. However, the array size may be 1.2 times the size of the conventional array.

In contrast, the use of two sets of 256 word line SRAM arrays may be 2.168 times as fast as the corresponding bit line discharge rate without sectional column SRAMs with 26.2 percent of its power consumption and 105 percent of its size in accordance with one embodiment of the invention. The use of a single set of SRAM word lines may be 96.9 percent of the size of a conventional array using two sets of 256 word line arrays, and may have 23.5 percent of the power consumption and 1.669 times the bit line discharge rate, according to one embodiment of the invention. Thus, of these exemplary architectures, the use of four sets may be the fastest, in some cases, but its size may not be the best in some cases. The use of one set may be superior to the use of a conventional array with two sets in speed, power consumption and size. Similarly, use of two sets may be superior to the use of four sets without the sectional column architecture in some embodiments of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor memory comprising:

a column;

a first and a second group of memory cells, said first and second groups each selectively couplable to said column, said first group coupled to said column when said second group is decoupled from said column; and a precharge circuit that automatically precharges said second group when said second group is decoupled from said column.

2. The memory of claim 1 further including a switch to selectively couple said first group to said column and to selectively decouple said second group from said column.

3. The memory of claim 2 including a first memory cell and a second memory cell, a pair of local columns, each local column coupled to said switch and to one of said cells, said switch further coupled to said column.

4. The memory of claim 3 wherein each of said first and second memory cells is coupled to a word line.

5. The memory of claim 4 wherein each group includes a plurality of cells on different word lines.

6. The memory of claim 3 wherein said switch selectively couples a random access memory cell in said first or second group to said column and selectively pre-charges said cell.

7. The memory of claim 6 wherein said switch includes a first transistor which may be selectively activated to couple said column to a memory cell and a second transistor which is active when said first transistor is inactive to selectively couple the memory cell to a supply voltage.

8. The memory of claim 7 wherein said first and second transistors have their gates coupled to the same potential, said first transistor being an N-type transistor and said second transistor being a P-type transistor.

9. The memory of claim 5 wherein said switch is coupled to a signal which indicates when any of the cells of a group is selected.

10. The memory of claim 1 including a group word line coupled to said first group, said first group including a plurality of cells and a plurality of word lines coupled to said group word line, each of said cells being on different word lines, said group word line going to a logic high when a word line within a said group of memory cells is selected.

11. The memory of claim 1 wherein said column includes a pair of bit lines and said memory is a static random access memory.

12. The memory of claim 3 wherein said column and said local columns are in different metallic interconnection layers.

13. The memory of claim 12 including word lines coupled to said cells, and wherein the local columns are in a lower metallic interconnection layer than said word lines and said word lines are in a lower metallic interconnection layer than said columns.

14. A static random access memory comprising:

first and second bit lines;

first and a second groups of static random access memory cells, said first and second groups each selectively couplable to said first and second bit lines, said first group coupled to said bit lines when said second group is decoupled from said bit lines; and a switch to selectively couple said first group to said bit lines and to selectively decouple said second group from said bit lines wherein said switch selectively couples a random access memory cell to said bit lines and selectively recharges said local bit lines.

15. The memory of claim 14 including a first random access memory cell and a second random access memory cell, a pair of local bit lines each coupled to said switch, and said switch further coupled to said first and second bit lines.

16. The memory of claim 15 wherein each group includes a plurality of cells on different word lines.

17. The memory of claim 14 including a first set of transistors that may be selectively activated to couple said bit lines to a random access memory cell and a second group of transistors which may be selectively activated when said first group of transistors are inactive to selectively couple the local bit lines to a supply voltage.

18. The memory of claim 17 wherein said first and second groups of transistors have their gates coupled to the same potential, said first group of transistors being N-type transistors and the second group of transistors being P-type transistors.

19. A method comprising:

accessing a first group of a plurality of memory cells coupled to a column of cells in a semiconductor memory; and decoupling a second group of a plurality of memory cells from the column when the first group is selectively coupled to the column; and precharging the second group of a plurality of memory cells which are decoupled from the column.

20. The method of claim 19 including selecting said first group using a word line signal.

21. The method of claim 20 including selectively coupling a static random access memory cell to a pair of bit lines acting as said column.

22. The method of claim 21 including selectively coupling one cell of said first group to a sense amplifier.

* * * * *